United States Patent
Oliveira et al.

(10) Patent No.: US 6,892,177 B2
(45) Date of Patent: May 10, 2005

(54) METHOD AND SYSTEM FOR ADJUSTING THE DYNAMIC RANGE OF A DIGITAL-TO-ANALOG CONVERTER IN A WIRELESS COMMUNICATIONS DEVICE

(75) Inventors: Louis Dominic Oliveira, San Diego, CA (US); Samir Kamar Gupta, San Diego, CA (US); Seyfollah Bazarjani, San Diego, CA (US); Wenjun Su, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 569 days.

(21) Appl. No.: 09/793,337

(22) Filed: Feb. 26, 2001

(65) Prior Publication Data

US 2002/0120457 A1 Aug. 29, 2002

(51) Int. Cl.$^7$ ............................................ G10L 21/00
(52) U.S. Cl. .................. 704/500; 341/139; 341/141; 341/144
(58) Field of Search ............................. 341/139, 144, 341/141, 131, 126, 138; 704/500, 201, 205, 258; 381/104, 61, 63; 360/15; 713/321, 330; 375/219

(56) References Cited

U.S. PATENT DOCUMENTS

| | | | | |
|---|---|---|---|---|
| 4,381,488 A | | 4/1983 | Fricke et al. | |
| 5,027,228 A | * | 6/1991 | Yokoyama | 360/15 |
| 5,208,866 A | | 5/1993 | Kato et al. | |
| 5,270,715 A | * | 12/1993 | Kano | 341/139 |
| 5,365,381 A | * | 11/1994 | Scheffler | 360/15 |
| 6,154,121 A | * | 11/2000 | Cairns et al. | 341/138 |
| 6,317,613 B1 | | 11/2001 | Brown, Jr. | |
| 6,462,689 B2 | * | 10/2002 | Wong et al. | 341/144 |
| 6,504,863 B1 | * | 1/2003 | Hellmark | 375/219 |

FOREIGN PATENT DOCUMENTS

FR    2783991    3/2000

* cited by examiner

Primary Examiner—Susan McFadden
Assistant Examiner—Huyen X. Vo
(74) Attorney, Agent, or Firm—Philip Wadsworth; Charles D. Brown; George C. Pappas

(57) ABSTRACT

A wireless communication device (100) may include a receiver (110), a memory (104), a digital-to-analog converter (128), an audio playback system (124) and other features. A dynamic range controller (130) selectively generates control signals to adjust, at least in part, the operational dynamic range of the digital-to-analog converter (128) for digital signals received by the receiver (110) or stored in the memory (104). The selection of dynamic range is based on identifying a characteristic. In one embodiment, the control signals are used to selectively operate the digital-to-analog converter (128) at a particular dynamic range based on a sampling rate of a received digital audio signal.

6 Claims, 3 Drawing Sheets

SYSTEM 100

METHOD AND SYSTEM FOR ADJUSTING THE DYNAMIC RANGE OF A DIGITAL-TO-ANALOG CONVERTER IN A WIRELESS COMMUNICATIONS DEVICE

FIELD OF THE INVENTION

The present invention is directed generally to a wireless communication device, and, more particularly, to a method and system for adjusting the dynamic range of a digital-to-analog converter in a wireless communication device.

BACKGROUND OF THE INVENTION

Wireless communication devices, such as cellular telephones, frequently include a digital-to-analog converter to convert digital signals into analog audio signals for playback on a speaker. The system may be used to play back voice signals, musical tones and the like.

The typical wireless communications device is battery-powered. Conservation of battery power is important to increase the operating duration of the device. Operating the digital-to-analog converter with a high dynamic range consumes a significant amount of power and therefore decreases the operating time of the device. Accordingly, it can be appreciated that there is a significant need for a method and system for adjusting the operational dynamic range of a digital-to-analog converter in a wireless communications device. The present invention provides this and other advantages as will be apparent from the following detailed description and accompanying figures.

SUMMARY OF THE INVENTION

The present invention is embodied in a method and system for adjusting the operational dynamic range of a digital-to-analog converter in a wireless communication device. In one embodiment, the system includes a receiver, a memory, a digital-to-analog converter and a speaker. The system receives a digital signal from a remote location and determines the appropriate dynamic range at which to operate the digital-to-analog converter. In another embodiment, the system determines the appropriate dynamic range at which to operate the digital-to-analog converter to play back a digital signal stored in the memory.

DETAILED DESCRIPTION OF THE PREFERRED EMBODIMENTS

The present invention provides intelligent control of a digital-to-analog converter in a wireless communication device, and, as a result, reduces battery drain. The present invention may be readily implemented in any wireless communication device. Although the examples presented herein refer to a cellular telephone, the principals of the present invention are applicable to any wireless communication device, including, but not limited to, analog and digital cellular telephones, personal communication system (PCS) devices, and the like.

Figure 1:
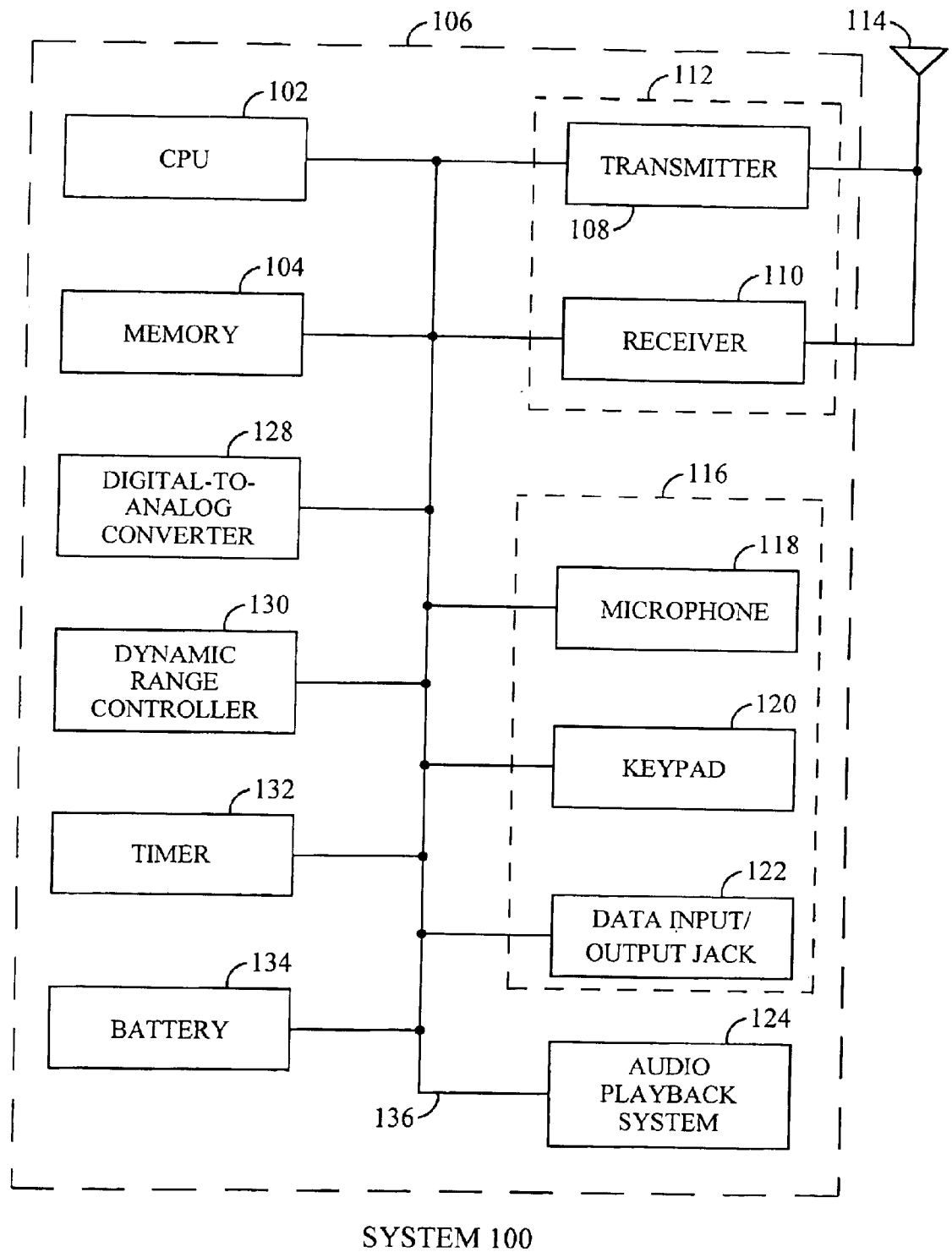
FIG. 1 is a functional block diagram of a wireless communication device implementing the present invention.

The present invention is embodied in a system 100 illustrated in the functional block diagram of FIG. 1. The system 100 includes a central processing unit (CPU) 102, which controls operation of the system. The CPU 102 may be satisfactorily implemented with a number of different computing devices, such as a microprocessor, microcontroller, custom-designed processor, application specific integrated circuit (ASIC), digital signal processor (DSP), or the like. The system 100 is not limited by the specific form of the CPU 102. A memory 104, which may include read-only memory (ROM), flash memory and/or random-access memory (RAM), provides instructions and data to the CPU 102. A portion of the memory 104 may also include non-volatile random-access memory.

The system 100, which is typically embodied in a wireless communication device such as a cellular telephone, also includes a housing 106 that contains a transmitter 108 and a receiver 110 to allow transmission and reception of data, such as audio communications and programming data, between the system 100 and a remote location, such as a base transceiver station (BTS) 150 (see FIG. 2), or the like. The transmitter 108 and the receiver 110 may be combined into a transceiver 112. An antenna 114 is attached to the housing 106 and electrically coupled to the transceiver 112. The operation of the transmitter 108, receiver 110, and antenna 114 is well-known in the art and need not be described herein. Although FIG. 1 illustrates the antenna 114 as extending from the housing 106, some designs may include an internal antenna that is contained completely within the housing. The transmitter 108, the receiver 110, and the antenna 114, however, operate in a conventional manner regardless of the location of the antenna.

A user-input device 116 is communicatively linked to the system 100 for operation by the user in a conventional manner. The user-input device 116 provides a convenient means by which destination telephone numbers, commands, digital images, audio data and other data may be entered by the user. Although FIG. 1 illustrates the user-input device 116 as comprising a microphone 118, a keypad 120, and a data-input/output jack 122 contained within the housing 106, other user input devices may be used, such as the receiver 110, and the like, and in various combinations.

Figure 2:
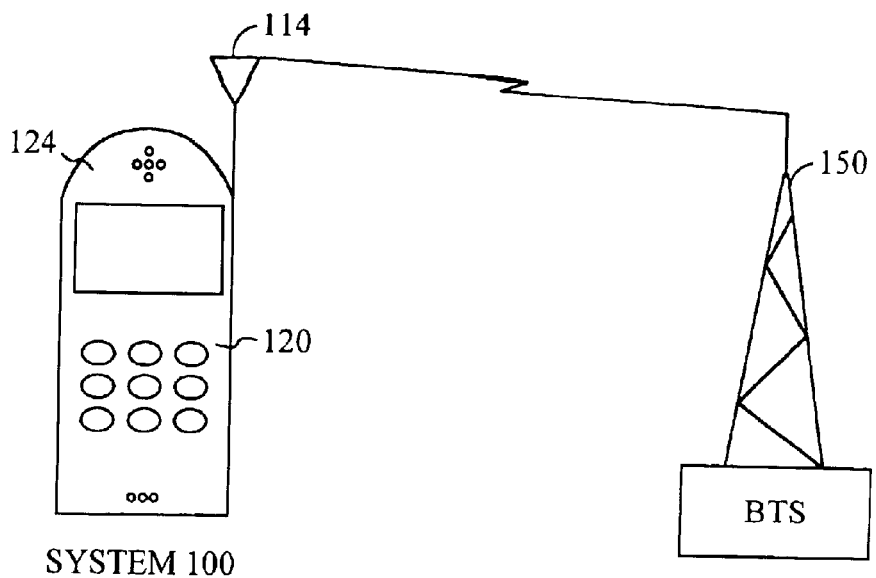
FIG. 2 illustrates the operation of the system of FIG. 1 to play audio data received from a remote location.

The system 100 also includes an audio playback system 124 that may be conveniently used to reproduce audio signals. Although FIG. 2 illustrates the audio playback system 124 as comprising a speaker, one skilled in the art will recognize that the audio playback system 124 may be comprised of other components, such as an amplifier (not shown), the data input/output jack 122, a headset (not shown), or a headphone 126 (See FIG. 3).

The system also includes a digital-to-analog converter (DAC) 128 that may be conveniently used to convert digital audio signals to analog audio signals for playback by the audio playback system 124. The DAC 128 may be configured to operate over various dynamic range settings or to shut down. The desired operational dynamic range of the DAC 128 may be related to the characteristics of the signal to be played back. For example, voice signals may be satisfactorily reproduced when the DAC 128 is set to operate at a particular dynamic range, but musical signals may require a higher dynamic range for satisfactory reproduction. Alternatively, the desired dynamic range may be related to another characteristic, such as a characteristic of user input received by the system 100. One skilled in the art will recognize that the specific dynamic range for a particular characteristic is a matter of engineering design choice.

For example, the DAC 128 may be configured to operate with a dynamic range of 75 dB to convert digital voice data to analog audio signals. Similarly, the DAC 128 may be configured to operate with a dynamic range of 90 dB to convert digital musical or ringer data to analog audio signals. One skilled in the art will recognize that the DAC 128 may also be implemented as part of an ASIC (not shown), or the like, containing other components of the system 100, such as the CPU 102.

The system 100 also includes a dynamic range controller (DRC) 130, which processes digital signals and which may typically be implemented as a set of program instructions executed by the CPU 102. As will be discussed in greater detail below, the system 100 may use the DRC 130 to selectively generate a control signal to adjust the operational dynamic range of the DAC 128 based on an identified characteristic. The identified characteristic may be a characteristic of a received digital signal, a characteristic of a stored digital signal, a characteristic of another input, or the like. One skilled in the art will recognize that the DRC 130 may be configured to selectively generate the control signal by the user or may be preset to do so at the factory, or some combination thereof.

The identified characteristics of a digital signal may include the type of signal (i.e., voice, ringer, musical, or non-audio), the sampling rate (e.g., 8 KHz, 16 KHz, 22.05 KHz, 24 KHz, 32 KHz, or 44.1 KHz sampled data), and the like, and various combinations thereof. The identified characteristics of other inputs may include user commands to playback digital signals in a particular manner or at a particular time, user settings indicating that a particular type of digital signal will be received, user power-mode settings, or the like, and various combinations thereof.

In one embodiment, the system 100 may also include a timer 132 for operation by the system to control the DRC 130 at predetermined time periods, as will be discussed in greater detail below. Electrical components of the system 100 receive power from a battery 134, which is attached to and supported by the housing 106. In an exemplary embodiment, the battery 134 is a rechargeable battery. In other embodiments, the system 100 may include a connector (not shown) for the connection of an external power source, such as an automobile power adapter, AC power adapter, or the like.

The various components of the system 100 are coupled together by a bus system 136 which may include a power bus, control bus, and status signal bus in addition to various data busses. For the sake of clarity, however, the various buses are illustrated in FIG. 1 as the bus system 136.

The operation of the system 100 to adjust the dynamic range of the DAC 128 may now be described more fully. For the sake of brevity, the system 100 will be described using a limited number of examples. Different examples may discuss different dynamic ranges. As discussed above, the specific dynamic range is typically selected based on the desired application. The present invention is not limited by a particular dynamic range or set of dynamic ranges.

In one embodiment the system 100 may be configured to generate control signals to adjust the operational dynamic range of the DAC 128 based on a characteristic of a signal received from a remote location. FIG. 2 illustrates the operation of the system 100 to playback a digital audio signal received from a remote location, such as the BTS 150.

In this example, the system 100 may be configured to operate the DAC 128 with a dynamic range of 80 dB if a digital signal received by the receiver 110 from the remote location is a voice digital signal. The system 100 receives a digital signal from the receiver 110. The DRC 130 is configured to identify a characteristic of the received signal indicating the signal is a voice digital signal and, upon identifying the characteristic, to generate control signals such that the operational dynamic range of the DAC 128 is 80 dB. Similarly, the system may be configured to operate the DAC 128 with a dynamic range of 98 dB if a digital signal received by the receiver 110 from the remote location is a musical digital signal. One skilled in the art will recognize that the dynamic range controller 130 may be configured to selectively generate control signals based, at least in part, on a characteristic of a signal received from the remote location by the user or may be preset to do so at the factory, or some combination thereof.

One skilled in the art also will recognize that the DRC 130 may be configured to identify a determined characteristic of a received signal in a variety of different ways. For example, the DRC 130 may monitor a received signal and identify whether a particular characteristic, such as an embedded code, is present that indicates the signal is of a particular type (i.e., a voice signal or a music signal). Similarly, a received signal may have a particular sampling rate (such as 8 KHz, 16 KHz, 22.05 KHz, 24 KHz, 32 KHz, 44.1 KHZ, or 48 KHz sampled data) based on the type of signal. For example, voice signals typically have lower bandwidth requirements and can use a lower sampling rate (e.g., 8 KHz) while musical signals have high bandwidth requirements and need a higher sampling rate (e.g., 48 KHz). The DRC 130 may be configured to identify the sampling rate and generate control signals based on the particular sampling rate. The particular manner in which the DRC 130 identifies a characteristic of a received signal is not the subject of this invention and need not be discussed in detail herein.

In another embodiment, the user may desire to restrict operation of the DAC 128 based upon a time-related characteristic. For example, the user may desire to allow playback of voice signals but prohibit playback of musical signals between the hours of 9:00 A.M. and 5:00 P.M. In this example, the DRC 130 may be configured monitor a timing signal from the timer 132 and to generate control signals to operate the DAC 128 with a dynamic range of 80 dB between the hours of 9:00 A.M. and 5:00 P.M. Similarly, the user may desire to disable all audio playback between 5:00 P.M. and 7:00 P.M. In this example, the DRC 130 may be configured to power down the DAC 128 between the hours of 5:00 P.M. and 7:00 P.M.

In another embodiment, the user may desire to adjust the operational dynamic range of the DAC 128 based on user input. For example, the user may wish to manually configure the system 100 to operate the DAC 128 with a dynamic range of 80 dB. In this example, the user inputs commands through the user-input device 116 to operate the DAC 128 with a dynamic range of 80 dB. The DRC 130 is configured to operate the DAC 128 with a dynamic range of 80 dB.

Figure 3:
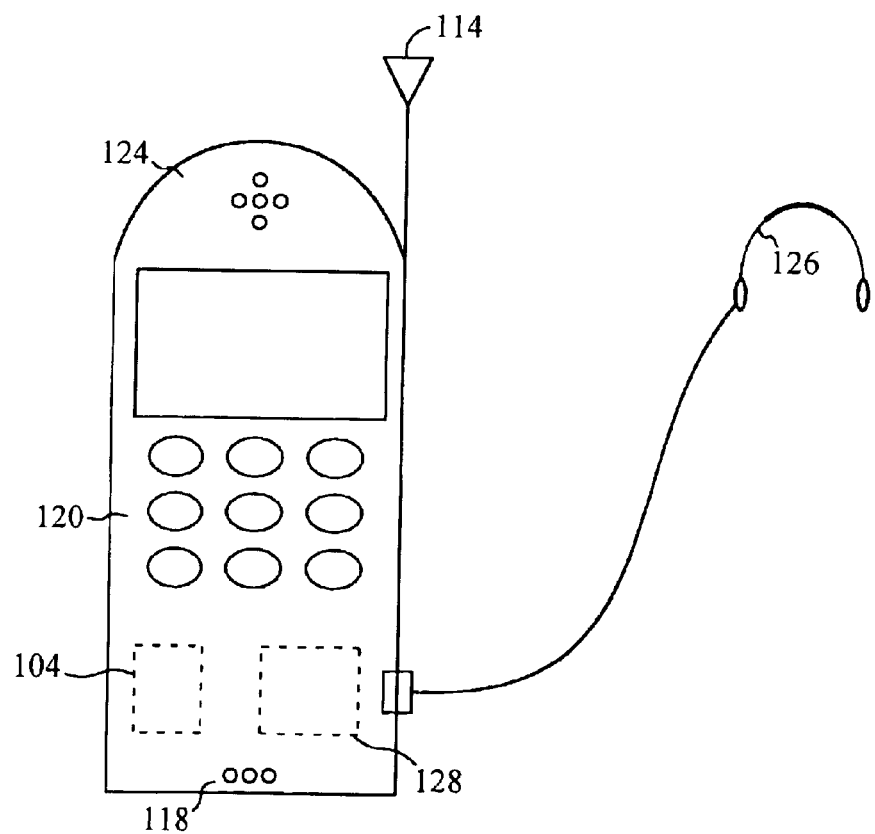
FIG. 3 illustrates the operation of the system of FIG. 1 to play audio data stored by the system.

In another embodiment, the user may desire to play digital audio signals stored in the memory 104. FIG. 3 illustrates the operation of the system 100 to playback a digital audio signal stored in the memory 104 through headphones 126. In this example, the user may have stored voice messages in the memory 104 for later playback or configured the system 100 to signal an incoming call by playing a musical tune stored in the memory 104. In this embodiment, the system 100 may be configured to generate control signals to adjust the operational dynamic range of the DAC 128 based on a characteristic of a signal stored in the memory 104. For example, the system 100 may be configured to operate the DAC 128 with a dynamic range of 75 dB if a digital signal stored in the memory 104 is a voice signal. The DRC 130 is configured to identify a characteristic of the stored signal indicating the signal is a voice signal, such as the sampling rate or an embedded code, and, upon identifying the characteristic, to generate control signals such that the operational dynamic range of the DAC 128 is 75 dB. Similarly, the system may be configured to operate the DAC 128 with a dynamic range of 90 dB if a digital signal stored in the memory 104 is a musical signal. One skilled in the art will recognize that the dynamic range controller 130 may be configured to selectively generate control signals based, at least in part, on a characteristic of the signal stored in the memory 104 by the user or may be preset to do so at the factory, or some combination thereof.

One skilled in the art will recognize that the DRC 130 may generate control signals to control the operation of other components of the system 100 to facilitate processing of a digital signal. For example, the DRC 130 may generate control signals to control the configuration of the bus system 136 (see FIG. 1). The bus system 136 can be configured to have a 13-bit data path for digital voice signals and a 16-bit data path for digital musical signals.

Figure 4:
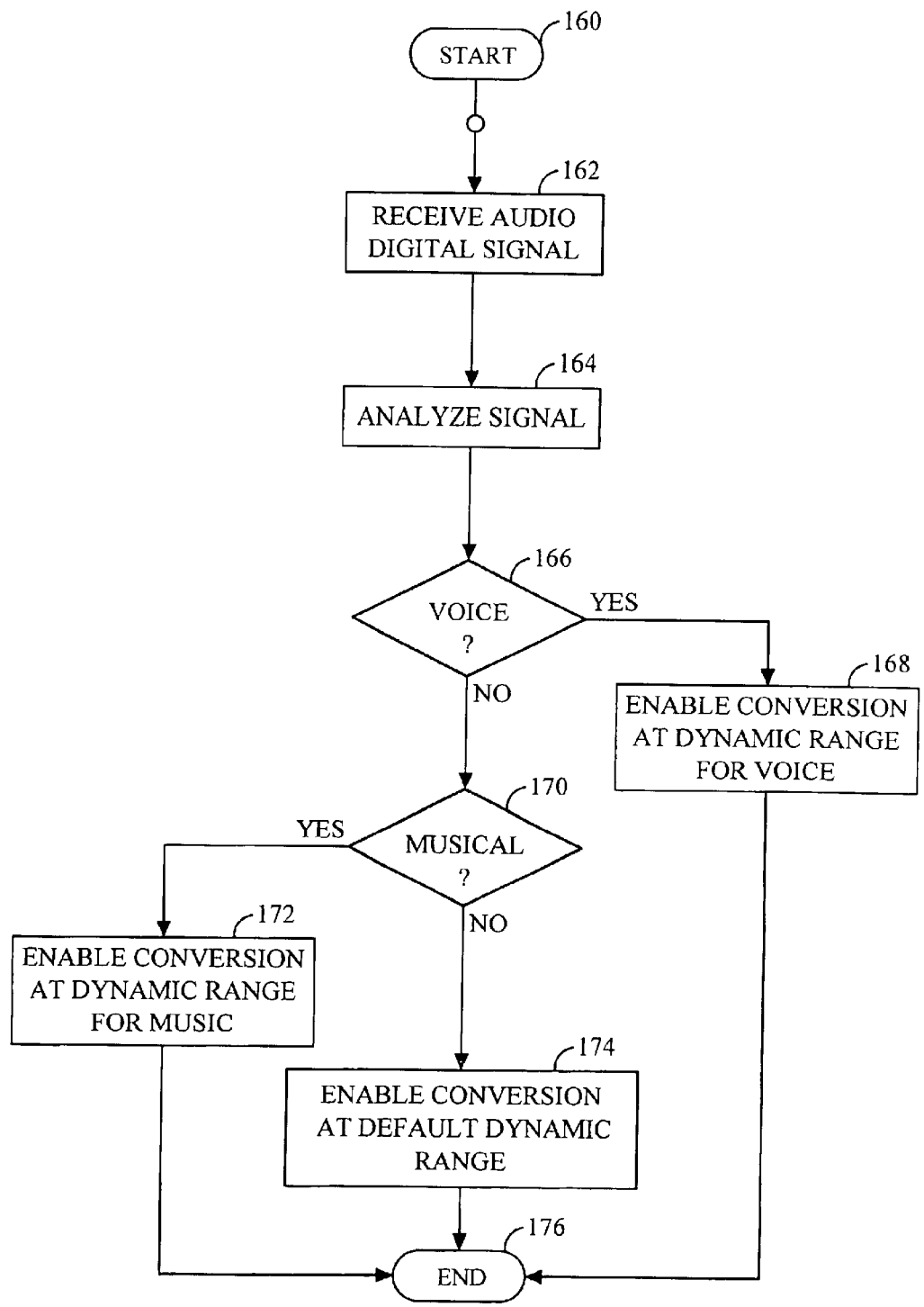
FIG. 4 is a flowchart illustrating the operation of the system of FIG. 1 to adjust the operational dynamic range of a digital-to-analog converter.

The operation of the system 100 to control the operational dynamic range of the DAC 128 based on the type of digital signal is illustrated in FIG. 4. At a start 160, the wireless communications device is under power. A step 162 the system 100 receives an digital audio signal from a remote location or retrieves a digital audio signal stored in the memory 104 (see FIG. 1).

At step 164, the digital audio signal is analyzed. The type of characteristics identified by the analysis has been discussed above. At decision 166 the system 100 identifies whether the received digital audio signal has a characteristic indicating it is a voice signal.

If the digital audio signal has a characteristic indicating it is a voice signal, the answer to decision 166 is YES. In that event the system proceeds to step 168. At step 168, the system 100 enables conversion of the digital voice signal to an analog voice signal at an operational dynamic range appropriate for a voice signal, such as 75 dB or 80 dB. The system 100 then ends the operation in step 176.

If the digital signal does not have a characteristic indicating it is a voice signal, the result of decision 166 is NO. In that event the system 100 proceeds to decision 170. At decision 170, the system 100 identifies whether the digital audio signal has a characteristic indicating it is a musical signal. If the digital audio signal has a characteristic indicating it is a musical signal, the answer to decision 170 is YES. In that event the system 100 proceeds to step 172. At step 172, the system 100 enables conversion of the digital musical signal to an analog musical signal at an operational dynamic range appropriate for a musical signal, such as 90 dB or 98 dB. The system 100 then ends the operation in step 176.

If the digital audio signal is not a musical signal, the answer to decision 170 is NO. In that event the system 100 proceeds to step 174. At step 174, the system 100 enables conversion of the digital audio signal to an analog audio signal at a default operational dynamic range, such as 90 dB. The system 100 then ends the operation in step 176.

Those skilled in the art will recognize that additional steps, such as error checking routines, may be performed. For the sake of brevity, those flowcharts will not be repeated herein. However, one of ordinary skill in the art may readily implement such processes based on the present disclosure.

Those skilled in the art will also recognize that the particular digital audio signal types, signal characteristics, user inputs, settings, dynamic ranges, sampling rates and time periods used above are illustrative only and that the present invention is not limited to the digital audio signal types, signal characteristics, user inputs, settings, dynamic ranges, sampling rates and time periods mentioned.

It is to be understood that even though various embodiments and advantages of the present invention have been set forth in the foregoing description, the above disclosure is illustrative only, and changes may be made in detail, yet remain within the broad principles of the invention. Therefore, the present invention is to be limited only by the appended claims.

What is claimed is:

1. An integrated circuit for use in a wireless device, comprising:

a digital-to-analog converter (DAC) operable in a first dynamic range to conserve power when incoming signals to be converted by the DAC are to be processed as voice signals, and in a second dynamic range for better recording or playback when the incoming signals to be converted by the DAC are to be processed as musical signals, means for detecting when signals processed by the DAC are to be processed as voice signals or musical signals; and means for controlling the DAC to operate at the first dynamic range or the second dynamic range in response to the detection.

2. The integrated circuit claim 1, wherein the means for detecting includes means for identifying user settings defining whether at any given time the signals should be processed as voice signals or musical signals.

3. In a wireless device including an DAC and a dynamic range controller (DRC), and the DAC being operable in a first dynamic range to conserve power when incoming signals to be converted by the DAC are to be processed as voice signals, and in a second dynamic range for better recording or playback when the incoming signals to be converted by the DAC are to be processed as musical signal, a method comprising the DRC performing the steps of:

detecting when signals processed by the DAC are to be processed as voice signals or musical signals; and controlling the DAC to operate at the first dynamic range or the second dynamic range in response to the detection.

4. The method of claim 3, further comprising identifying user settings defining whether at any given time the signals should be processed as voice signals or musical signals.

5. A computer readable medium comprising instructions that, upon execution in a wireless device that include DAC and DRC, where the DAC is operable in a first dynamic range to conserve power when incoming signals to be converted by the DAC are to be processed as voice signals, and in a second dynamic range for better recording or playback when the incoming signals to be converted by the DAC are to be processed as musical signal, a method comprising the DRC performing the steps of:

detect when signals processed by the DAC are to be processed as voice signals or musical signals; and control the DAC to operate at the first dynamic range or the second dynamic range in response to the detection.

6. The computer readable media of claim 5, further comprising instructions to identify user settings defining whether at any given time the signals should be processed as voice signals or musical signals.

* * * * *